United States Patent
Murano

(10) Patent No.: US 10,667,446 B2
(45) Date of Patent: May 26, 2020

(54) COMPONENT PICKUP RATE CALCULATING SYSTEM FOR A COMPONENT MOUNTER

(71) Applicant: FUJI MACHINE MFG. CO., LTD., Chiryu-shi (JP)

(72) Inventor: Yoichi Murano, Toyoake (JP)

(73) Assignee: FUJI CORPORATION, Chiryu-shi (JP)

( * ) Notice: Subject to any disclaimer, the term of this patent is extended or adjusted under 35 U.S.C. 154(b) by 282 days.

(21) Appl. No.: 15/564,012

(22) PCT Filed: Apr. 8, 2015

(86) PCT No.: PCT/JP2015/060987
§ 371 (c)(1),
(2) Date: Oct. 3, 2017

(87) PCT Pub. No.: WO2016/162974
PCT Pub. Date: Oct. 13, 2016

(65) Prior Publication Data
US 2018/0139876 A1  May 17, 2018

(51) Int. Cl.
*G05B 19/408* (2006.01)
*H05K 13/04* (2006.01)
(Continued)

(52) U.S. Cl.
CPC ......... *H05K 13/02* (2013.01); *G05B 19/4086* (2013.01); *G05B 19/41875* (2013.01);
(Continued)

(58) Field of Classification Search
CPC ......... G05B 19/4086; G05B 19/41875; H05K 13/02; H05K 13/0215; H05K 13/0417;
(Continued)

(56) References Cited

U.S. PATENT DOCUMENTS

| 6,027,019 A | * | 2/2000 | Kou | H05K 13/0452 |
| | | | | 235/375 |
| 2005/0161498 A1 | * | 7/2005 | Byskov | H05K 13/087 |
| | | | | 235/376 |

(Continued)

FOREIGN PATENT DOCUMENTS

| EP | 1 793 660 A1 | 6/2007 |
| EP | 1 821 589 A1 | 8/2007 |

(Continued)

OTHER PUBLICATIONS

Extended European Search Report dated Mar. 14, 2018 in corresponding European Patent Application No. 15888467.6 citing documents AA, AB, AC, AD, AO and AP therein, 8 pages.

(Continued)

*Primary Examiner* — Michael J Huntley
(74) *Attorney, Agent, or Firm* — Oblon, McClelland, Maier & Neustadt, L.L.P.

(57) ABSTRACT

A production management computer totals the data of the component pickup operation quantity of the suction nozzle and the pickup error quantity sent from control device of each component mounter for each type of component, and calculates the ratio of the pickup quantity or the ratio of the pickup error quantity with respect to the component pickup operation quantity of the suction nozzle for each type of component as a component pickup rate. Here, production management computer separately calculates an after-feeder-setting component pickup rate, a main component pickup rate, a near-tape-trailing-end component pickup rate, and an after-splicing component pickup rate as component pickup rates for each type of component.

5 Claims, 3 Drawing Sheets

(51) Int. Cl.
*H05K 13/02* (2006.01)
*G05B 19/418* (2006.01)
*H05K 13/08* (2006.01)

(52) U.S. Cl.
CPC ..... *H05K 13/0215* (2018.08); *H05K 13/0417* (2013.01); *H05K 13/0419* (2018.08); *H05K 13/083* (2018.08); *H05K 13/0895* (2018.08)

(58) Field of Classification Search
CPC ............. H05K 13/0419; H05K 13/083; H05K 13/0895
See application file for complete search history.

(56) References Cited

U.S. PATENT DOCUMENTS

| | | | |
|---|---|---|---|
| 2007/0011869 A1 | 1/2007 | Watanabe et al. | |
| 2007/0130756 A1 | 6/2007 | Watanabe et al. | |
| 2008/0147232 A1* | 6/2008 | Kuribayashi | H05K 13/0895 700/160 |
| 2008/0201940 A1* | 8/2008 | Watanabe | H05K 13/0417 29/740 |
| 2009/0119912 A1 | 5/2009 | Watanabe et al. | |
| 2010/0186223 A1 | 7/2010 | Watanabe et al. | |
| 2010/0325860 A1 | 12/2010 | Maenishi | |
| 2014/0270473 A1* | 9/2014 | Youngquist | H05K 13/0417 382/147 |
| 2015/0296629 A1* | 10/2015 | Yamazaki | H05K 13/083 29/739 |
| 2016/0249499 A1* | 8/2016 | Sumi | H05K 13/0413 |
| 2017/0049013 A1* | 2/2017 | Kanai | H05K 13/0417 |

FOREIGN PATENT DOCUMENTS

| | | |
|---|---|---|
| JP | 11-204992 A | 7/1999 |
| JP | 2006-49337 A | 2/2006 |
| JP | 2006-100332 A | 4/2006 |
| JP | 2008-283081 A | 11/2008 |
| JP | 2009-224764 A | 10/2009 |

OTHER PUBLICATIONS

International Search Report dated Jul. 14, 2015 in PCT/JP2015/060987 filed Apr. 8, 2015.

* cited by examiner

COMPONENT PICKUP RATE CALCULATING SYSTEM FOR A COMPONENT MOUNTER

TECHNICAL FIELD

The present application relates to a component pickup rate calculating system for a component mounter that picks up components supplied from a tape feeder using a suction nozzle and mounts the components on a circuit board.

BACKGROUND ART

With a component mounter disclosed in patent literature 1 (JP-A-2006-100332), for each tape feeder that supplies components (or for each component type or each suction nozzle), the component pickup operation quantity of a suction nozzle is counted, a pickup error quantity of when a suction nozzle could not pick up a component (or a pickup quantity of when a suction nozzle could pick up a component) is counted, a ratio of the pickup quantity or the pickup error quantity to the component pickup operation quantity of the suction nozzle is calculated as a "component pickup rate", and in case in which there is a tape feeder for which the component pickup rate worsens to a notice level or a warning level, displays a notice or a warning on a display section, so as to prompt an operator to perform maintenance or the like on the tape feeder.

CITATION LIST

Patent Literature

Patent Literature 1: JP-A-2006-100332

SUMMARY

Technical Problem

However, various reasons can be considered for causing a pickup error, such as: (1) a mistake in the work of setting component supply tape on the tape feeder, (2) a mistake in the work of setting the tape feeder on the component mounter, (3) a tape feeding problem caused by the way the component supply tape is wound, (4) a problem with a splicing tape connection used to join a trailing end of the component supply tape to a new component supply tape, or (5) a problem such as a dirty nozzle or the like. Pickup errors occurring due to each cause are not limited to occurring distributed along the entire region of one component supply tape, and there are cases in which the areas for which pickup errors occur are different for each cause. For example, pickup errors that occur due to mistakes in work of setting component supply tape on a tape feeder, or mistakes in work of setting a tape feeder on a component mounter have a tendency to occur during the initial (first) component pickup operation immediately after the tape feeder is set on the component mounter. Also, pickup errors that occur due to tape feeding problems caused by the way the component supply tape is wound occur in an area near the end (near the trailing end of the tape) towards the inside of the component supply tape wound around the reel. And, pickup errors that occur due to tape connection problems caused by splicing occur in an area of the component supply tape directly after splicing. Further, for pickup errors that occur due to dirty suction nozzles, the occurrence location depends on when the nozzle becomes dirty.

However, in the above patent literature 1, because a component pickup rate is only calculated for each tape feeder (or each component type, or each suction nozzle), an operator only knows a tape feeder (or component type or suction nozzle) for which the component pickup rate has worsened, they do not know the reason for the worse component pickup rate. Therefore, when a component pickup rate worsens, an operator performs various general countermeasures such as cleaning of suction nozzles or maintenance of mounting heads, work that might not be required if the cause of the worse component pickup rate was known, and has to try and find the cause of the worse component pickup rate by trial and error, which is extremely troublesome.

Solution to Problem

To solve the above problems, the present disclosure is a component pickup rate calculating system for a component mounter that picks up components supplied by a tape feeder and mounts the components on a circuit board, the system including: a first counting means configured to count a component pickup operation quantity of a suction nozzle during operation of the component mounter; a second counting means configured to count a pickup error rate representing cases in which the suction nozzle could not pick up the component, or a pickup rate representing cases in which the suction nozzle could pick up a component; and a component pickup rate calculating means configured to calculate a ratio of the pickup rate or a ratio of the pickup error rate with respect to the component pickup operation quantity of the suction nozzle (a component pickup success rate or a component pickup failure rate) as a component pickup rate based on a count value of the first counting means and a count value of the second counting means, wherein the component pickup rate calculating means is configured to calculate separate of the component pickup rates, the separate component pickup rates being a component pickup rate for a region until a specified quantity (one or multiple times) of component pickup operations immediately after the tape feeder is set on the component mounter or a region until a feeding length of component supply tape set on the tape feeder is a specified length (hereinafter referred to as "after-feeder-setting component pickup rate"), and a component pickup rate after the region has passed (hereinafter referred to as "main component pickup rate").

Accordingly, with the present disclosure, because the component pickup rate (component pickup success rate or component pickup failure rate) is calculated separately as an after-feeder-setting component pickup rate and a main component pickup rate, an operator is able to distinguish between an occurrence rate of pickup errors that occur during component pickup operation immediately after the tape feeder has been set on the component mounter (after-feeder-setting component pickup rate), and an occurrence rate of pickup errors that occur subsequently to that (main component pickup rate). By this, the operator is able to, in a case in which the after-feeder-setting component pickup rate worsens, estimate that the cause is a mistake in work of setting the component supply tape on the tape feeder or a mistake in work of setting the tape feeder on the component mounter, so as to be able to easily find countermeasures, thus preventing the need to perform trial and error unnecessary work as is the case conventionally when not knowing the cause of the worse component pickup rate. Also, the operator, in a case in which the main component pickup rate worsens, is able to estimate that the cause is a general one such as a dirty suction nozzle or incorrect adjustment of tape feeding of a tape feeder, and thus can perform general countermeasures such as cleaning or exchange of suction nozzles, or maintenance and so on of the tape feeder.

In this case, the component pickup rate calculating means may be configured to calculate a component pickup rate during initial component pickup operations immediately after the tape feeder is set on the component mounter as the after-feeder-setting component pickup rate, and in a case of performing a recovery pickup operation (also known as retry pickup operation) when a pickup error occurs with the initial component pickup operation, the component pickup rate during the recovery pickup operation may be included in the after-feeder-setting component pickup rate but not included in the main component pickup rate. As above, pickup errors that occur due to a mistake in work of setting component supply tape on a tape feeder, or due to a mistake in work of setting a tape feeder on a component mounter have a tendency to occur during the initial component pickup operation immediately after the tape feeder is set on the component mounter, so when a pickup error occurs during an initial component pickup operation, because pickup errors occur consecutively even if recovery pickup operation is performed due to problems in the take-up of top film (also known as top tape or cover tape) of the component supply tape, until pickup of a component is successful, the component pickup rate of during recovery pickup operations is not included in the main component pickup rate. By this, the main component pickup rate is prevented from being worsened by pickup errors that occur during recovery pickup operations immediately after a tape feeder has been set on a component mounter.

With the present disclosure, calculation of the component pickup rate may be performed for each tape feeder, each suction nozzle, or each type of component, and, for example, when calculating the component pickup rate for each type of component, the first counting means may be configured to total the component pickup operation quantity of the suction nozzle for each type of component supplied by the tape feeder, the second counting means may be configured to total the pickup error quantity or the pickup quantity for each type of component supplied by the tape feeder, and the component pickup rate calculating means may be configured to calculate the after-feeder-setting component pickup rate and the main component pickup rate based on a total value of the first counting means and a total value of the second counting means for each type of component supplied by the tape feeder. By this, it is possible to calculate an after-feeder-setting component pickup rate and a main component pickup rate for each type of component.

Also, with the present disclosure, the component pickup rate calculating means may be configured to set a region for calculating the main component pickup rate as a region from after the region for calculating the after-feeding-setting component pickup rate has passed until a remaining length of the component supply tape loaded on the tape feeder, or until a component remaining quantity has reached a specified value, and then calculate a component pickup rate of after reaching the remaining length of the component supply tape or of the component remaining quantity reaching the specified value as a near-tape-trailing-end component pickup rate. As above, because pickup errors that occur because of tape feeding problems due to the way the component supply tape is wound occur in a region near the end (near the tape trailing end) towards the inside of the component supply tape wound on the reel, by calculating the component pickup rate of after a remaining length of component supply tape has been reached or of the component remaining quantity reaching a specified value as the near-tape-trailing-end component pickup rate separate to the main component pickup rate, in case in which the near-tape-trailing-end component pickup rate worsens, an operator is able to estimate that the cause is a tape feeding problem due to the way the component supply tape is wound, thus preventing the need to perform trial and error unnecessary work as is the case conventionally when not knowing the cause of the worse component pickup rate.

Also, the component pickup rate calculating means may be configured to, in a case in which splicing is performed to connect a new component supply tape to the trailing end of the component supply tape set on the tape feeder, calculate a component pickup rate of a region within a specified length from a tape connecting position as an after-splicing component pickup rate. As above, because pickup errors that occur because of tape connection problems due to splicing occur in a region immediately after splicing of the component supply tape, by calculating the component pickup rate of a region within a specified length from a tape connecting position as the after-splicing component pickup rate, in a case in which the after-splicing component pickup rate worsens, an operator is able to estimate that the cause is a tape connection problem due to splicing, thus preventing the need to perform trial and error unnecessary work as is the case conventionally when not knowing the cause of the worse component pickup rate.

DESCRIPTION OF EMBODIMENTS

Figure 1:
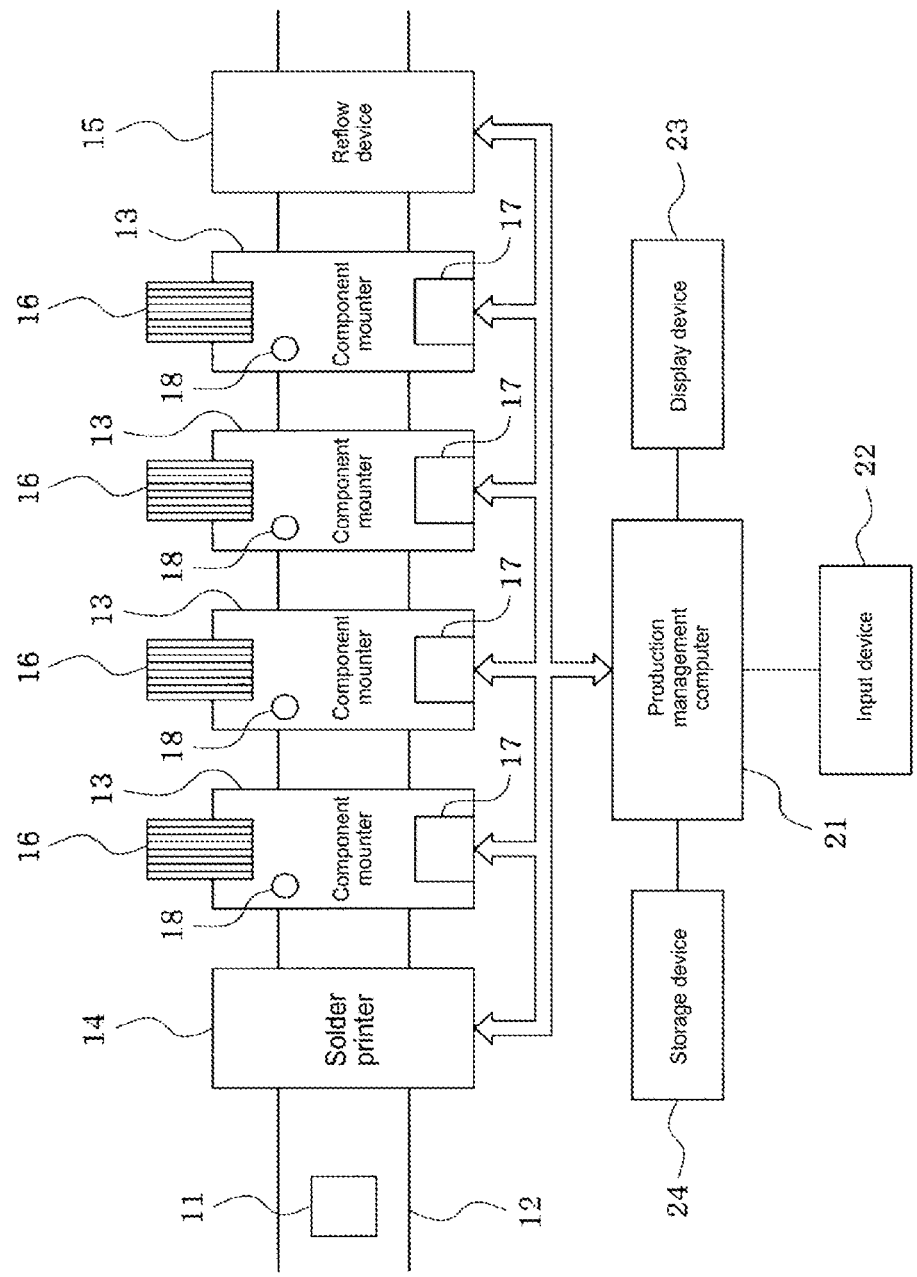
FIG. 1 is a block diagram showing the configuration of a component mounting line which is an embodiment of the present disclosure.

An embodiment of the disclosure is described below. First, the configuration of a component mounting line will be described based on FIG. 1.

Multiple (at least one) component mounters 13 that mount components on circuit board 11 and mounting related machines that perform work related to component mounting (devices other than the component mounters) are lined up along conveyance line 12 (conveyance path) along which circuit board 11 is conveyed. Here, a mounting related machine may be, for example, solder printer 14, reflow device 15, an adhesive applying device, an appearance inspection device, or the like. In a first embodiment, solder printer 14 is arranged furthest upstream (at the head) of the component mounting line, and reflow device 15 is arranged furthest downstream (at the tail) of the component mounting line.

Multiple tape feeders 16 that each supply components are exchangeably set on each component mounter 13. Although not shown, one or multiple suction nozzles that picks up a component from tape feeder 16 and mounts the component on circuit board 11 are exchangeably held on a mounting head of each component mounter 13.

Control device 17 of each component mounter 13 controls component pickup operation of using a suction nozzle to pick up a component supplied from tape feeder 16, and, by moving the component picked up by the suction nozzle to an imaging area of camera 18 used for component imaging, performing imaging with camera 18, and processing the captured image, control device 17 recognizes whether the component picked up by the suction nozzle is present, and any deviation and so on in the pickup position, and, in a case in which the component is recognized as being not present, determines that a component pickup error (pickup failure) has occurred, and performs recovery pickup operation (also known as retry pickup operation) of returning to the component pickup area and performing component pickup operation again. In a case in which a component cannot be picked up even after repeating the above recovery pickup operation a specified preset number of times, it is determined that some kind of error has occurred, so an error-stop is performed, and an operator is notified of the error-stop by a warning display or warning sound. On the other hand, in a case in which a component is recognized as being held on the suction nozzle (pickup success), the suction nozzle is moved to the component mounting area, the pickup position deviation of the component is corrected, and the component is mounted on circuit board 11.

Control device 17 of each component mounter 13 functions as a first counting means configured to count a component pickup operation quantity of a suction nozzle for each type of component supplied by tape feeder 16 during operation of each component mounter 13, and functions as a second counting means configured to count a pickup error quantity for which a component could not be picked up (and/or a pickup quantity for which a component could be picked up) by a suction nozzle for each type of the components. Note that, when it is recognized that there is an error with the pickup orientation of the component picked up by the suction nozzle based on the processing result of the image captured by camera 18 (for example, slanted pickup, tombstone pickup, and so on), that component may be discarded in a specified discard box or the like, and recovery pickup operation may be performed, or, in this case, a pickup orientation error may also be included in "pickup errors" and counted in the pickup error quantity. Also, both the pickup error quantity and the pickup quantity may be counted, or only one of them may be counted. Because "component pickup operation quantity=pickup error quantity+pickup quantity", using the component pickup operation quantity it is possible to calculate one of the pickup error quantity and the pickup quantity from the other.

Control device 17 of each component mounter 13 sends data of the component pickup operation quantity and the pickup error quantity (and/or the pickup quantity) counted by the first counting means and the second counting means to production management computer 21 that manages production of the component mounting line. Connected to this production management computer 21 are: input device 22 such as a keyboard, mouse, and touch panel; display device 23 such as an LCD, EL, or CRT; and storage device 24 on which is memorized various programs and data of the component pickup rate calculating program of FIG. 4, which is described below.

Production management computer 21, by performing the component pickup rate calculating program of FIG. 4, which is described below, functions as the component pickup rate calculating means configured to total the data of the component pickup operation quantity of the suction nozzle and the pickup error quantity (and/or pickup quantity) sent from control device 17 of each component mounter 13 for each type of component, and calculate the ratio of the pickup quantity or the ratio of the pickup error quantity with respect to the component pickup operation quantity of the suction nozzle for each type of component as a component pickup rate (a component pickup success rate or a component pickup failure rate). In the present embodiment, production management computer 21 separately calculates an after-feeder-setting component pickup rate, a main component pickup rate, a near-tape-trailing-end component pickup rate, and an after-splicing component pickup rate (refer to FIGS. 2 and 3) as component pickup rates for each type of component.

The component pickup rates of each area (each region) are calculated based on one of the following by using the component pickup operation quantity and the pickup error quantity or pickup quantity counted in each area.

When taking the component pickup success rate as the "component pickup rate", calculations are made using formula (1) or formula (2) below.

$$\text{component pickup rate}=(\text{pickup quantity}/\text{component pickup operation quantity})\times 100[\%] \quad (1)$$

$$\text{component pickup rate}=\{1-(\text{pickup error quantity}/\text{component pickup operation quantity}\}\times 100[\%] \quad (2)$$

When taking the component failure rate as the "component pickup rate", calculations are made using formula (3) or formula (4) below.

$$\text{component pickup rate}=(\text{pickup error quantity}/\text{component pickup operation quantity})\times 100[\%] \quad (3)$$

$$\text{component pickup rate}=\{1-(\text{pickup quantity}/\text{component pickup operation quantity}\}\times 100[\%] \quad (4)$$

Figure 2:
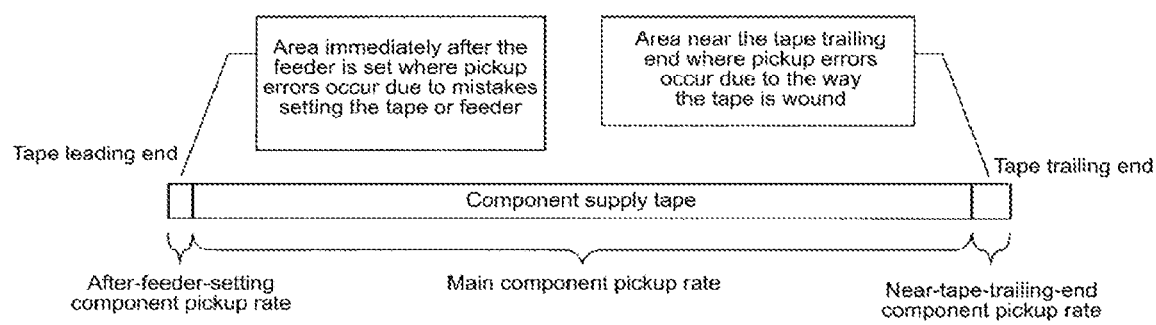
FIG. 2 illustrates, on a single component supply tape, an area (region) for calculating an after-feeder-setting component pickup rate, an area for calculating a main component pickup rate, and an area for calculating a near-tape-trailing-end component pickup rate.

As shown in FIG. 2, the after-feeding-setting component pickup rate is the component pickup rate of an area (region) immediately after tape feeder 16 is set on component mounter 13, specifically, is the component pickup rate calculated until the component pickup operation quantity immediately after tape feeder 16 was set on component mounter 13 reaches a specified quantity (once or multiple times) or until the feeding length (feeding pitch quantity) of the component supply tape loaded on tape feeder 16 reaches a specified value. For pickup errors that occur in the area immediately after tape feeder 16 is set on component mounter 13, there is a high possibility that the pickup error occurred due to a mistake in the work of setting the component supply tape on tape feeder 16, or due to a mistake in the work of setting tape feeder 16 on component mounter 13.

The main component pickup rate is a component pickup rate calculated for the area on one component supply tape between the area used for calculating the after-feeder-setting component pickup rate and the area for calculating the near-tape-trailing-end component pickup rate.

In the present embodiment, a component pickup rate during initial component pickup operations immediately after tape feeder 16 is set on component mounter 13 is calculated as the after-feeder-setting component pickup rate, and in a case of performing a recovery pickup operation when a pickup error occurs with the initial component pickup operation, the component pickup rate during the recovery pickup operation may be included in the afterfeeder-setting component pickup rate but not included in the main component pickup rate. As above, pickup errors that occur due to a mistake in work of setting component supply tape on tape feeder 16, or due to a mistake in work of setting tape feeder 16 on component mounter 13 have a tendency to occur during the initial component pickup operation immediately after tape feeder 16 is set on component mounter 13, so when a pickup error occurs during an initial component pickup operation, because pickup errors occur consecutively even if recovery pickup operation is performed due to problems in the take-up of top film (also known as top tape or cover tape) of the component supply tape, until pickup of a component is successful, the component pickup rate of during recovery pickup operations is not included in the main component pickup rate. By this, the main component pickup rate is prevented from being worsened by pickup errors that occur during recovery pickup operations immediately after tape feeder 16 has been set on component mounter 13.

The near-tape-trailing-end component pickup rate is a component pickup rate calculated in an area near the trailing end towards the inside of the component supply tape wound around the reel, specifically, is a component pickup rate calculated for an area after a remaining length of the component supply tape or the component remaining quantity has reached a specified value. For pickup errors that occur in an area near the trailing end of the tape, there is a high possibility that the pickup error occurred due to the way the component supply tape is wound or due to a tape feeding problem.

Figure 3:
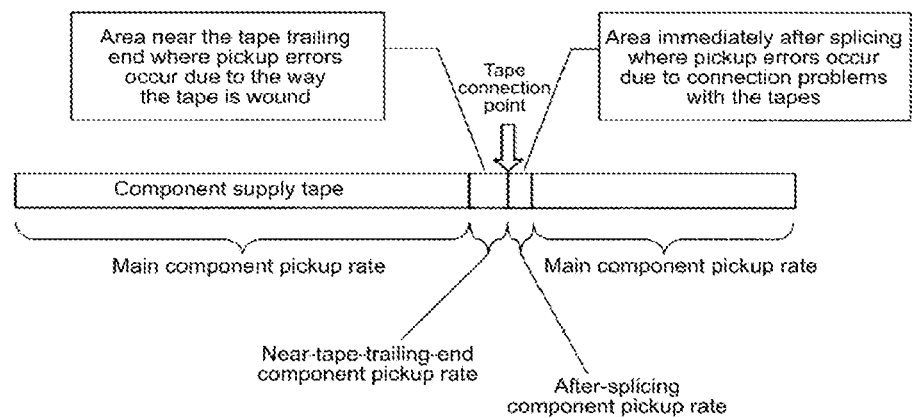
FIG. 3 illustrates, on component supply tape on which splicing has been performed, an area (region) for calculating a main component pickup rate, an area for calculating a near-tape-trailing-end component pickup rate, and an area for calculating an after-splicing component pickup rate.

In a case in which splicing is being performed in which a new component supply tape is spliced to a trailing end of the component supply tape set on tape feeder 16, as shown in FIG. 3, an after-splicing component pickup rate is calculated. The after-splicing component pickup rate is a component pickup rate calculated in an area immediately after splicing (specifically, an area within a specified length from the tape connection position). For pickup errors that occur in the area immediately after splicing, there is a high possibility that the pickup error occurred due to a splicing tape connecting problem.

If the component pickup rate of any of the areas worsens to a notification level or a warning level, the area for which the component pickup rate has worsened and the component pickup rate in question are displayed on display device 23 of production management computer 21 (and/or on a display device of the component mounter 13 in question). Also, the configuration is such that an operator can operate input device 22 or the like to switch the display of display device 23 to a list of component pickup rates of each area for each type of component.

Calculating processing of component pickup rates of each area of the component supply tape as described above is performed as follows by production management computer 21 according to the component pickup rate calculating program of FIG. 4.

Figure 4:
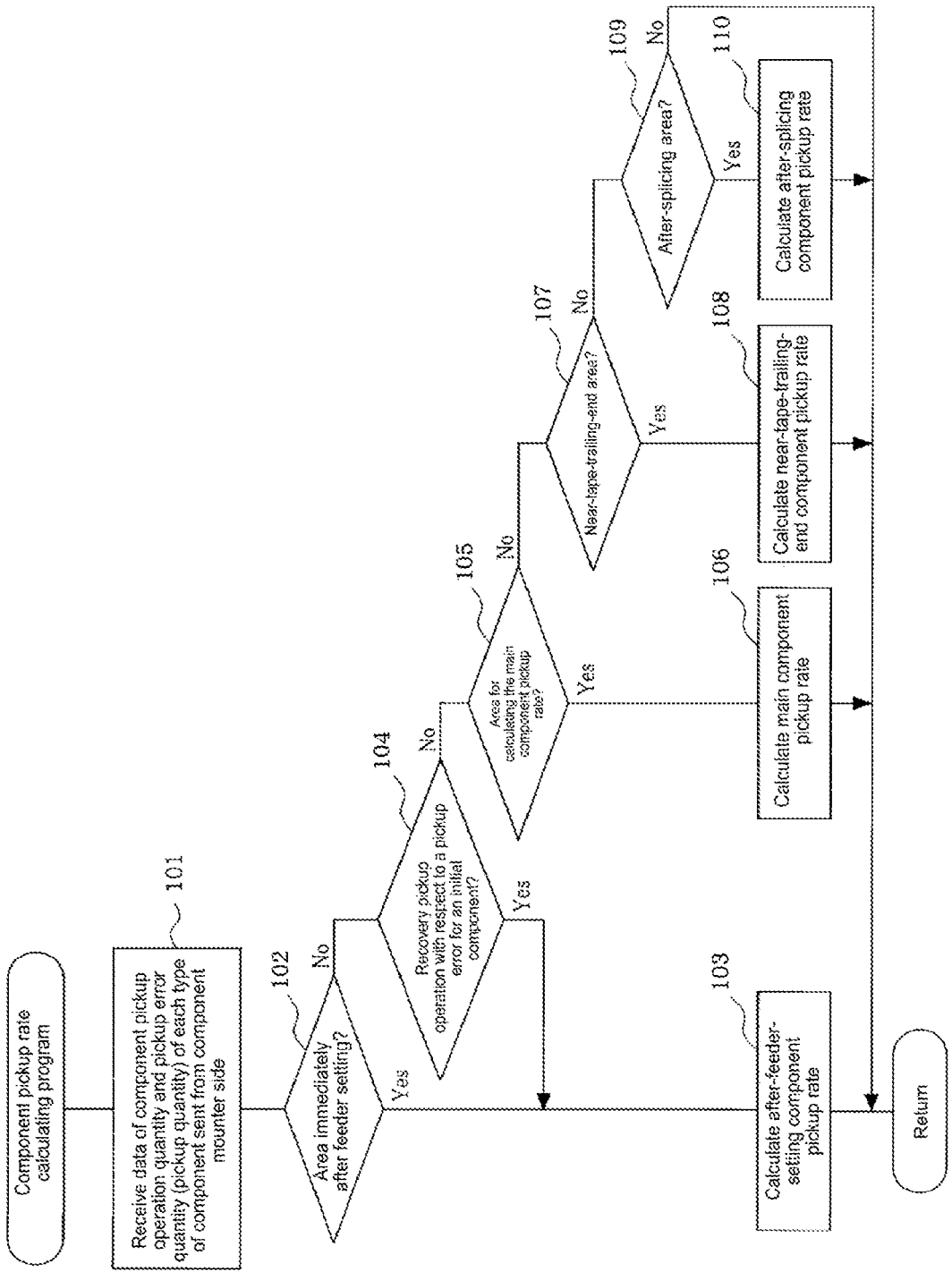
FIG. 4 is a flowchart showing the flow of processing of a component pickup rate calculating program.

The component pickup rate calculating program of FIG. 4 is performed repeatedly during operation of component mounter 13 at a specified interval. When the program is started, first, in step 101, data of the component pickup operation quantity and the pickup error quantity (or pickup quantity) of each type of component sent from control device 17 of component mounter 13 is received.

Then, continuing to step 102, it is determined whether it is the area immediately after feeder setting (the area immediately after tape feeder 16 is set on component mounter 13), and if it is determined that it is the area immediately after feeder setting, processing continues to step 103, and data of the component pickup operation quantity and the pickup error quantity (or pickup quantity) at the area immediately after feeder setting is totaled for each type of component, and an after-feeder-setting component pickup rate is calculated for each type of component.

On the other hand, if it is determined in step 102 that it is not the area immediately after feeder setting, processing continues to step 104 and it is determined whether it is recovery pickup operation with respect to a pickup error for an initial component. From the result, if it is determined that it is recovery pickup operation with respect to a pickup error for an initial component, processing continues to step 103, and data of the component pickup operation quantity and the pickup error quantity (or pickup quantity) during the recovery pickup operations is totaled with the data calculating the after-feeder-setting component pickup rate, and the after-feeder-setting component pickup rate is calculated. By this, the component pickup rate during recovery pickup operations is included in the after-feeder-setting component pickup rate, but is not included the main component pickup rate.

In step 104 above, if it is determined that it is not recovery pickup operation with respect to a pickup error of an initial component, processing continues to step 105, and it is determined whether it is the area for calculating the main component pickup rate. From this result, if it is determined that it is the area for calculating the main component pickup rate, processing continues to step 106, and data of the component pickup operation quantity and pickup error quantity (pickup quantity) for the area is totaled for each type of component, and the main component pickup rate is calculated for each type of component.

On the other hand, in step 105 if it is determined that it is not the area for calculating the main component pickup rate, processing continues to step 107, and it is determined whether it is the near-tape-trailing-end area. From this result, if it is determined that it is the near-tape-trailing-end area, processing continues to step 108, and data of the component pickup operation quantity and pickup error quantity (pickup quantity) for the area near the tape trailing end is totaled for each component, and the near-tape-trailing-end component pickup rate is calculated for each type of component.

In step 107 above, if it is determined that it is not the near-tape-trailing-end area, processing continues to step 109 and it is determined whether it is the area immediately after splicing. From this result, if it is determined that it is the area immediately after splicing, processing continues to step 110, and data of the component pickup operation quantity and pickup error quantity (pickup quantity) for the area immediately after splicing is totaled for each component, and the after-splicing component pickup rate is calculated for each type of component. Note that, in step 109 above, if it determined that it is not the area immediately after splicing, the program ends. By repeatedly performing this program at a specified interval during operation of component mounter 13, a component pickup rate of each area of the component supply tape is calculated for each type of component.

According to the above embodiment, because the component pickup rate (component pickup success rate or component pickup failure rate) is calculated separately as an after-feeder-setting component pickup rate and a main component pickup rate, an operator is able to distinguish between an occurrence rate of pickup errors that occur during component pickup operation immediately after tape feeder 16 has been set on component mounter 13 (after-feeder-setting component pickup rate), and an occurrence rate of pickup errors that occur subsequently to that (main component pickup rate). By this, the operator is able to, in a case in which the after-feeder-setting component pickup rate worsens, estimate that the cause is a mistake in the work of setting the component supply tape on tape feeder 16 or due to a mistake in the work of setting tape feeder 16 on component mounter 13, so as to be able to easily find countermeasures, thus preventing the need to perform trial and error unnecessary work as is the case conventionally when not knowing the cause of the worse component pickup rate. Also, the operator, in a case in which the main component pickup rate worsens, is able to estimate that the cause is a general one such as a dirty suction nozzle or incorrect adjustment of tape feeding of tape feeder 16, and thus can perform general countermeasures such as cleaning or exchange of suction nozzles, or maintenance and so on of tape feeder 16.

For example, in a case in which the component quantity of the component supply tape set on tape feeder 16 is one thousand, and the component pickup operation specified quantity in the area immediately after feeder setting is five, if a pickup error occurs once due to a mistake in the work of setting the component supply tape on tape feeder 16 or due to a mistake in the work of setting tape feeder 16 on component mounter 13, if there are no other pickup errors due to other causes, the overall component pickup rate for the component supply tape is 99.9%, thus, just by looking at an overall component pickup rate for the component supply tape as conventionally, it is unknown what the cause of the pickup error is, and therefore unknown what countermeasure should be performed.

With respect to this, with the present embodiment, in a case of the example above, the after-feeder-setting component pickup rate is 25%, and the main component pickup rate is 100%, therefore it can be understood that general countermeasures such as cleaning or exchange of suction nozzles, or maintenance and so on of tape feeder 16, are not required, but that improvement is needed in the work of setting the component supply tape on tape feeder 16, or in the work of setting tape feeder 16 on component mounter 13.

Generally, pickup errors that occur due to a mistake in work of setting component supply tape on tape feeder 16, or due to a mistake in work of setting tape feeder 16 on component mounter 13 have a tendency to occur during the initial component pickup operation immediately after tape feeder 16 is set on component mounter 13, so when a pickup error occurs during an initial component pickup operation, pickup errors may occur consecutively even if recovery pickup operation is performed due to problems in the take-up of top film of the component supply tape; considering this, in the present embodiment, when recovery pickup operation is performed when a pickup error occurred in initial component pickup operations immediately after tape feeder 16 was set on component mounter 13, the component pickup rate during the recover pickup operations is included in the after-feeder-setting component pickup rate but not included in the main component pickup rate; thanks to this, it is possible to prevent worsening of the main component pickup rate due to a pickup error during recovery pickup operation immediately after tape feeder 16 is set on component mounter 13.

Also, considering that pickup errors that occur because of tape feeding problems due to the way the component supply tape is wound occur in an area near the end (near the tape trailing end) towards the inside of the component supply tape wound on the reel, in the present embodiment, because the near-tape-trailing-end component pickup rate is calculated separate to the main component pickup rate, in case in which the near-tape-trailing-end component pickup rate worsens, an operator is able to estimate that the cause is a tape feeding problem due to the way the component supply tape is wound, thus preventing the need to perform trial and error unnecessary work as is the case conventionally when not knowing the cause of the worse component pickup rate.

Further, considering that pickup errors that occur because of tape connection problems due to splicing occur in an area immediately after splicing of the component supply tape, in the present embodiment, because the after-splicing component pickup rate is calculated separately from the component pickup rate in other areas, in a case in which the after-splicing component pickup rate worsens, an operator is able to estimate that the cause is a tape connection problem due to splicing, thus preventing the need to perform trial and error unnecessary work as is the case conventionally when not knowing the cause of the worse component pickup rate.

Note that, in the present embodiment, the component pickup rate is calculated separately as an after-feeder-setting component pickup rate, a main component pickup rate, a near-tape-trailing-end component pickup rate, and an after-splicing component pickup rate, but so long as the after-feeder-setting component pickup rate and the main component pickup rate are calculated separately, either one or both of the near-tape-trailing-end component pickup rate and the after-splicing component pickup rate need not be calculated.

Also, in the present embodiment, the component pickup rate of each area is calculated for each type of component, but the component pickup of each area may be calculated for each tape feeder or each suction nozzle.

Also, in the present embodiment, production management computer 21 that manages production of the component mounting line calculates the component pickup rate of each component mounter 13, but control device 17 of each component mounter 13 may calculate the component pickup rate of each area of the component supply tape, and the component pickup rate of each area may be displayed on the display device of each component mounter 13.

In addition, the present disclosure is not limited to the embodiments described above and it goes without saying that various embodiments with changes that do not extend beyond the scope of the disclosure are possible, such as that suitable changes may be made to the configuration of the component mounting line.

REFERENCE SIGNS LIST

13: component mounter; 16: tape feeder; 17: control device (first counting means, second counting means); 18: camera; 21: production management computer (component pickup rate calculating means); 23: display device

The invention claimed is:
1. A component pickup rate calculating system for a component mounter that picks up components supplied by a tape feeder and mounts the components on a circuit board, the system comprising:
 a control device comprising:
 a first counter configured to count a component pickup operation quantity of a suction nozzle during operation of the component mounter, and
 a second counter configured to count a pickup error rate representing cases in which the suction nozzle could not pick up the component, or a pickup rate representing cases in which the suction nozzle could pick up a component; and a production management computer configured to calculate a ratio of the pickup rate or a ratio of the pickup error rate with respect to the component pickup operation quantity of the suction nozzle as a component pickup rate based on a count value of the first control device and a count value of the second control device, wherein the production management computer is configured to:

calculate separate component pickup rates, the separate component pickup rates being a component pickup rate for a region until a specified quantity of component pickup operations immediately after the tape feeder is set on the component mounter or a region until a feeding length of component supply tape set on the tape feeder is a specified length as an after-feeder setting component pickup rate, and a component pickup rate after the region has passed as a main component pickup rate, and determine when one of the component pickup rates reaches a notification or warning level, the production management computer displaying a list of component pickup rates with the notification or warning when the level is reached.

2. The component pickup rate calculating system for a component mounter according to claim 1, wherein the production management computer is configured to calculate a component pickup rate during initial component pickup operations immediately after the tape feeder is set on the component mounter as the after-feeder-setting component pickup rate, and in a case of performing a recovery pickup operation when the pickup error occurs with the initial component pickup operation, the component pickup rate during the recovery pickup operation is included in the after-feeder-setting component pickup rate but not included in the main component pickup rate.

3. The component pickup rate calculating system for a component mounter according to claim 1, wherein the first counter is configured to total the component pickup operation quantity of the suction nozzle for each type of component supplied by the tape feeder, the second counter is configured to total the pickup error quantity or the pickup quantity for each type of component supplied by the tape feeder, and the production management computer is configured to calculate the after-feeder-setting component pickup rate and the main component pickup rate based on a total value of the first counter and a total value of the second counter for each type of component supplied by the tape feeder.

4. The component pickup rate calculating system for a component mounter according to claim 1, wherein the production management computer is configured to set a region for calculating the main component pickup rate as a region from after the region for calculating the after-feeding-setting component pickup rate has passed until a remaining length of the component supply tape loaded on the tape feeder, or until a component remaining quantity has reached a specified value, and then calculate a component pickup rate of after reaching the remaining length of the component supply tape or of the component remaining quantity reaching the specified value as a near-tape-trailing-end component pickup rate.

5. The component pickup rate calculating system for a component mounter according to claim 1, wherein the production management computer is configured to, in a case in which splicing is performed to connect a new component supply tape to the trailing end of the component supply tape set on the tape feeder, calculate a component pickup rate of a region within a specified length from a tape connecting position as an after-splicing component pickup rate.

* * * * *

UNITED STATES PATENT AND TRADEMARK OFFICE
CERTIFICATE OF CORRECTION

| | | |
|---|---|---|
| PATENT NO. | : 10,667,446 B2 | Page 1 of 1 |
| APPLICATION NO. | : 15/564012 | |
| DATED | : May 26, 2020 | |
| INVENTOR(S) | : Yoichi Murano | |

It is certified that error appears in the above-identified patent and that said Letters Patent is hereby corrected as shown below:

On the Title Page

Item (71), the Applicant is incorrect. Item (71) should read:
-- (71): Applicant: FUJI CORPORATION, Chiryu-shi (JP) --

Signed and Sealed this
Fifteenth Day of September, 2020

Andrei Iancu
*Director of the United States Patent and Trademark Office*